(12) United States Patent
Jang

(10) Patent No.: US 9,076,894 B2
(45) Date of Patent: Jul. 7, 2015

(54) SEMICONDUCTOR DEVICE, LIGHT EMITTING DEVICE USING THE SAME, AND LIGHT EMITTING DEVICE PACKAGE INCLUDING THE SAME

(71) Applicant: LG INNOTEK CO., LTD., Seoul (KR)

(72) Inventor: Jung Hun Jang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/267,306

(22) Filed: May 1, 2014

(65) Prior Publication Data

US 2014/0332821 A1 Nov. 13, 2014

(30) Foreign Application Priority Data

May 9, 2013 (KR) .......................... 10-2013-0052661

(51) Int. Cl.

| | | |
|---|---|---|
| H01L 21/00 | (2006.01) | |
| H01L 33/00 | (2010.01) | |
| H01L 29/778 | (2006.01) | |
| H01L 33/12 | (2010.01) | |
| H01L 33/32 | (2010.01) | |
| H01L 29/20 | (2006.01) | |

(52) U.S. Cl.
CPC ........ *H01L 33/0025* (2013.01); *H01L 29/7787* (2013.01); *H01L 33/12* (2013.01); *H01L 33/32* (2013.01); *H01L 29/2003* (2013.01); *H01L 2224/48091* (2013.01); *H01L 2924/1305* (2013.01)

(58) Field of Classification Search
CPC . H01L 33/0025; H01L 33/12; H01L 29/7787; H01L 29/2003; H01L 33/32; H01L 2924/1305; H01L 2224/48091
USPC ................................................ 257/98, 76, 190
See application file for complete search history.

(56) References Cited

U.S. PATENT DOCUMENTS

| | | | |
|---|---|---|---|
| 2013/0037819 A1 | 2/2013 | Jang et al. | 257/76 |
| 2013/0062612 A1 | 3/2013 | Shioda et al. | 257/76 |
| 2014/0225139 A1* | 8/2014 | Park et al. | 257/98 |
| 2014/0327013 A1* | 11/2014 | Schenk et al. | 257/76 |

FOREIGN PATENT DOCUMENTS

| | | | | |
|---|---|---|---|---|
| EP | 2 538 434 A1 | 12/2012 | | |
| WO | WO 2013/001014 | * 3/2013 | | 29/872 |

OTHER PUBLICATIONS

Extended Europe Search Report dated Sep. 17, 2014 issued in Application No. 14 162 537.6.

* cited by examiner

*Primary Examiner* — Laura Menz
(74) *Attorney, Agent, or Firm* — Ked & Associates, LLP

(57) ABSTRACT

A semiconductor device includes a silicon substrate, an initial buffer layer disposed on the silicon substrate, a transition layer disposed on the initial buffer layer, and a device structure disposed on the transition layer. The transition layer includes at least one of $Al_xGa_{1-x}N$ (where $0<x<1$) layers provided on the initial buffer layer and an inserted buffer layer provided at least one of between the $Al_xGa_{1-x}N$ layers, at a lower end portion of the transition layer, or at an upper end portion of the transition layer.

11 Claims, 17 Drawing Sheets

SEMICONDUCTOR DEVICE, LIGHT EMITTING DEVICE USING THE SAME, AND LIGHT EMITTING DEVICE PACKAGE INCLUDING THE SAME

CROSS REFERENCE TO RELATED APPLICATION

This application claims priority under 35 U.S.C. §119 to Korean Patent Application No. 10-2013-0052661, filed in Korea on 9 May 2013, which is hereby incorporated in its entirety by reference as if fully set forth herein.

BACKGROUND

1. Field

Embodiments relate to a semiconductor device, a light emitting device using the same, and a light emitting device package including the same.

2. Background

Group III-V compound semiconductors such as GaN are widely used in optoelectronics and the like due to wide bandgap, adjustable bandgap, and the like. Such GaN is generally grown on a sapphire substrate or a silicon carbide (SiC) substrate. However, these substrates are not suitable for large diameter application and, in particular, the SiC substrate is expensive.

FIG. 1 is a view of a general semiconductor device. Referring to FIG. 1, the semiconductor device includes a silicon substrate 5 and a GaN layer 7. To address the above-described problems, the silicon substrate 5 that is cheaper than the sapphire substrate or the SiC substrate, easily realizes large diameter and has high thermal conductivity is used. When the GaN layer 7 is disposed on the silicon substrate 5, however, lattice mismatch between GaN and silicon is very high and there is a very big difference between coefficients of thermal expansion thereof, and thus, various problems that deteriorate crystallinity, such as melt-back, cracks, pits, surface morphology defects, and the like, may occur.

For example, cracks may be caused by tensile strain occurring when the GaN layer 7 grown at high temperature is cooled. For these reasons, there is a need to develop a semiconductor device that does not cause these problems even when the silicon substrate 5 is used and has a structure capable of providing good characteristics.

BRIEF DESCRIPTION OF THE DRAWINGS

The embodiments will be described in detail with reference to the following drawings in which like reference numerals refer to like elements wherein.

DETAILED DESCRIPTION

Hereinafter, embodiments will be described in detail with reference to the annexed drawings. However, the disclosure may be embodied in many different forms and should not be construed as being limited to embodiments set forth herein. Rather, these embodiments are provided so that this disclosure will be thorough and complete, and will fully convey the scope of the disclosure to those skilled in the art.

It will be understood that when an element is referred to as being "on" or "under" another element, it can be directly on/under the element or one or more intervening elements may also be present. When an element is referred to as being "on" or "under", "under the element" as well as "on the element" can be included based on the element. Additionally, relative terms, such as "first" or "second" and "upper" or "lower," may be used herein only to distinguish one entity or element from another entity or element without necessarily requiring or implying physical or logical relationship or order between such entities or elements.

Figure 1:
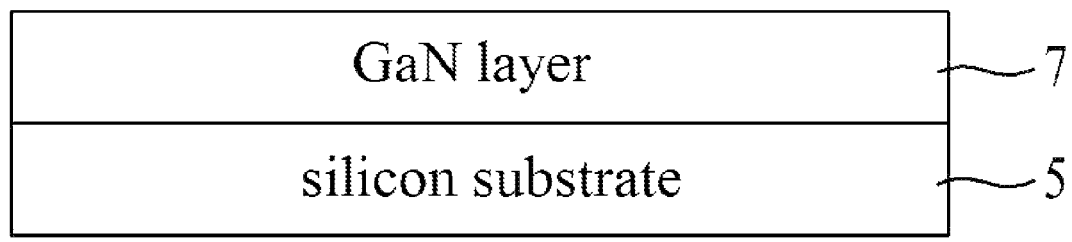
FIG. 1 is a view of a general semiconductor device.
Figure 2:
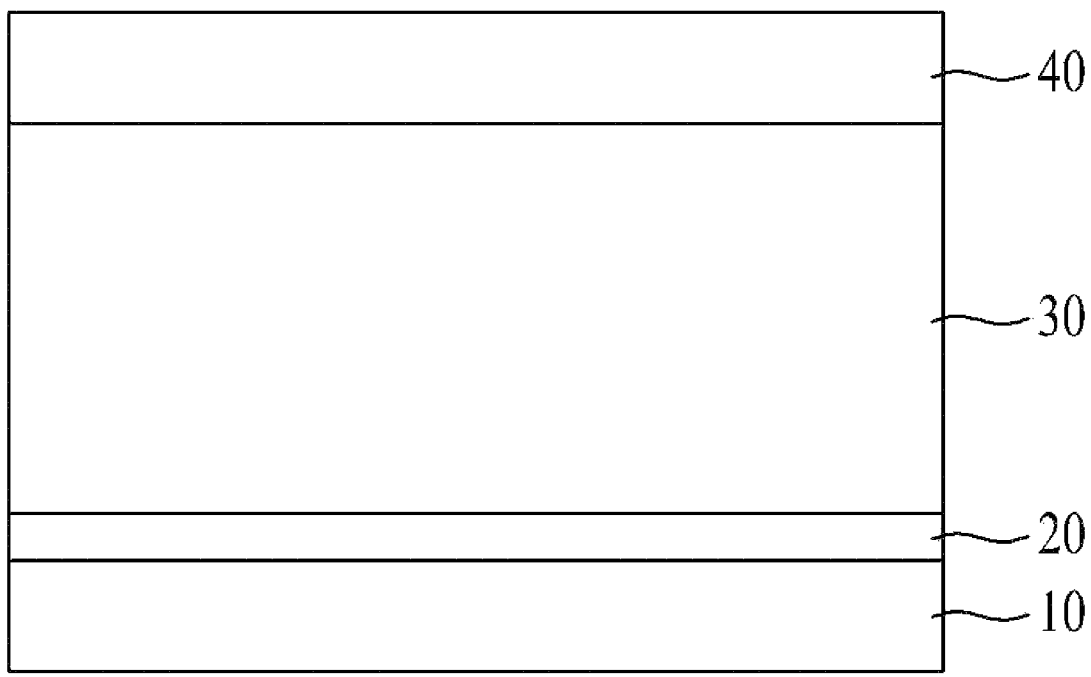
FIG. 2 is a sectional view of a semiconductor device according to an embodiment.

Referring to FIG. 2, the semiconductor device 100A includes a substrate 10, an initial buffer layer 20, a transition layer 30, and a device layer 40. The substrate 10 may include a conductive material or a non-conductive material. For example, the substrate 10 may include at least one of sapphire (Al2O3), GaN, SiC, ZnO, GaP, InP, Ga2O3, GaAs, or Si, but the disclosure is not limited thereto. For example, the substrate 10 may be a silicon substrate having a (111) crystal plane as a main plane.

The initial buffer layer 20 is disposed on the substrate 10 and may include at least one of an AlN layer, an AlAs layer, or a SiC layer. When the initial buffer layer 20 has a critical thickness or more, diffusion of silicon atoms from the silicon substrate 10 is prevented, thereby preventing melt-back. The term "critical thickness" as used herein means a thickness that may allow diffusion of silicon atoms from the silicon substrate 10. Thus, the initial buffer layer 20 may have a thickness of several tens to several hundreds of nanometers, for example, a thickness of greater than 10 nm to less than 300 nm.

The transition layer 30 is disposed on the initial buffer layer 20. According to an embodiment, the transition layer 30 includes a plurality of AlxGa1-xN (where 0<x<1) layers and an inserted buffer layer. The AlxGa1-xN layers are disposed on the initial buffer layer 20. The AlxGa1-xN layers may have an Al concentration gradient in which the x values gradually decrease with increasing distance from the initial buffer layer 20. In addition, the thicknesses of the AlxGa1-xN layers may increase with increasing distance from the initial buffer layer 20.

The inserted buffer layer is disposed at at least one of between the AlxGa1-xN layers, lower end portion of the transition layer 30, or upper end portion of the transition layer 30 and may not have a super lattice structure. In this regard, the upper end portion of the transition layer 30 means an upper portion of the AlxGa1-xN layers and the lower end portion of the transition layer 30 means a lower portion of the AlxGa1-xN layers. For example, the upper end portion of the transition layer 30 may mean the uppermost end of the transition layer 30 and the lower end portion of the transition layer 30 may mean the lowermost end of the transition layer 30.

Disposition of the inserted buffer layer will be described below in detail with reference to FIGS. 3A to 3F. The inserted buffer layer may include at least one AlN layer. In addition, the AlN layer may be a layer grown at a lower temperature (LT) of 750° C. to 950° C. or a high temperature (HT) of 1000° C. to 1100° C.

In addition, when the thickness of the AlN layer as the inserted buffer layer is less than 10 nm, it may be difficult to prevent strain relaxation. On the other hand, when the thickness of the AlN layer exceeds 50 nm, crystallinity may be deteriorated. Thus, the AlN layer may have a thickness of 10 nm to 50 nm. The inserted buffer layer serves to prevent strain relaxation.

Hereinafter, various embodiments of the transition layer 30 will be described below with reference to FIGS. 3A to 3F. FIGS. 3A to 3F are sectional views illustrating embodiments (i.e., transition layers 30A to 30F) of the transition layer 30 of FIG. 2.

The AlxGa1−xN layers of the transition layer 30 may include first to Kth AlxGa1−xN layers sequentially disposed on the initial buffer layer 20. In this regard, K may be a positive integer of 1 to 7. For example, K=3 in the transition layers 30A to 30D respectively illustrated in FIGS. 3A to 3D, K=2 in the transition layer 30E illustrated in FIG. 3E, and K=1 in the transition layer 30F illustrated in FIG. 3F.

The first to Kth AlxGa1−xN layers may have an Al concentration gradient according to distance from the initial buffer layer 20. For example, the x values may gradually decrease with increasing distance from the initial buffer layer 20. For example, when the x values of first to third AlxGa1−xN layers 32, 34 and 36 illustrated in FIGS. 3A to 3D are denoted as x1, x2, and x3, respectively, the x1, x2 and x3 values satisfy the relationship represented by Equation 1 below.

$$x1 > x2 > x3 \quad \text{[Equation 1]}$$

The AlN layer constituting the inserted buffer layer may include M AlN layers, wherein M is a positive integer and $1 \leq M \leq K+1$, the M AlN layers are disposed between any two adjacent AlxGa1−xN layers, and/or at a lower end portion of the transition layer, and/or at an upper end portion of the transition layer.

Figure 3A:
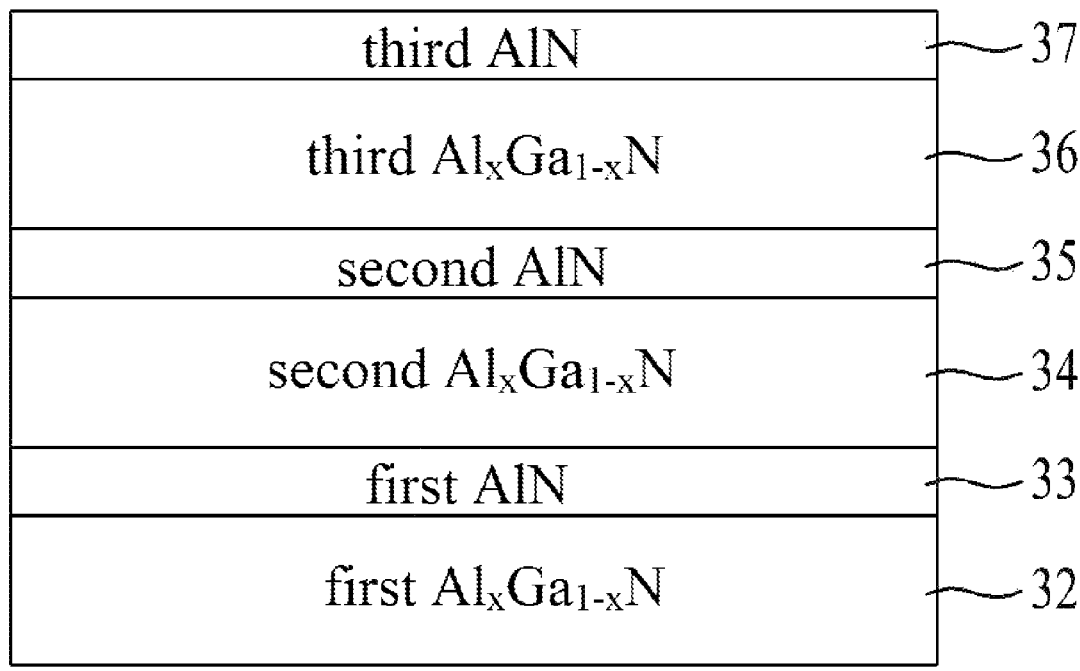
FIGS. 3A to 3F are sectional views illustrating embodiments of a transition layer of FIG. 2.

According to an embodiment, the AlN layer constituting the inserted buffer layer may include first to Kth AlN layers respectively disposed on the first to Kth AlxGa1−xN layers. For example, as illustrated in FIG. 3A, in the transition layer 30A, first, second and third AlN layers 33, 35 and 37 as the inserted buffer layers may be respectively disposed on the first to third AlxGa1−xN layers 32, 34 and 36.

Figure 3B:
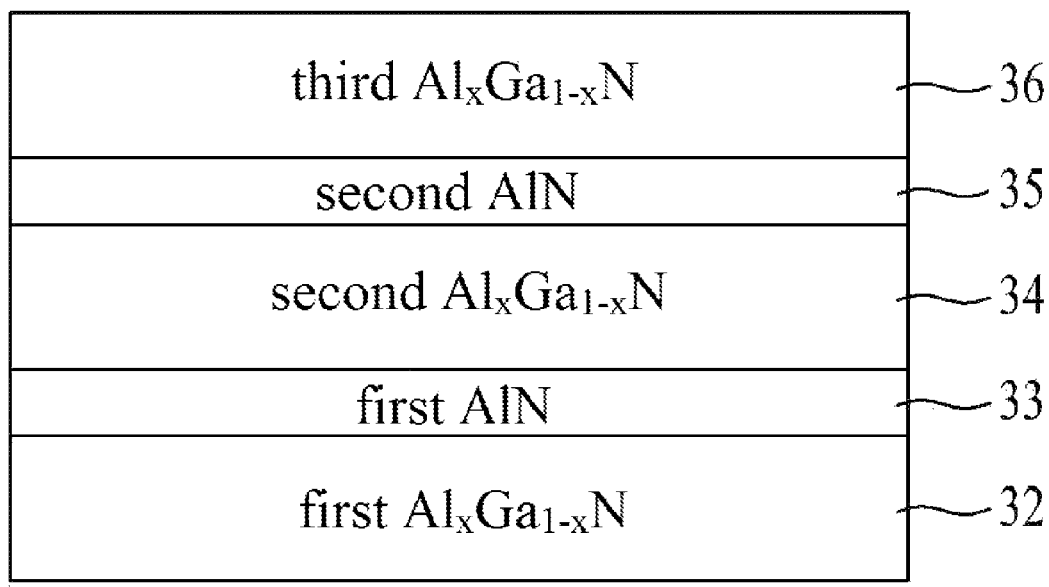
Figure 3C:
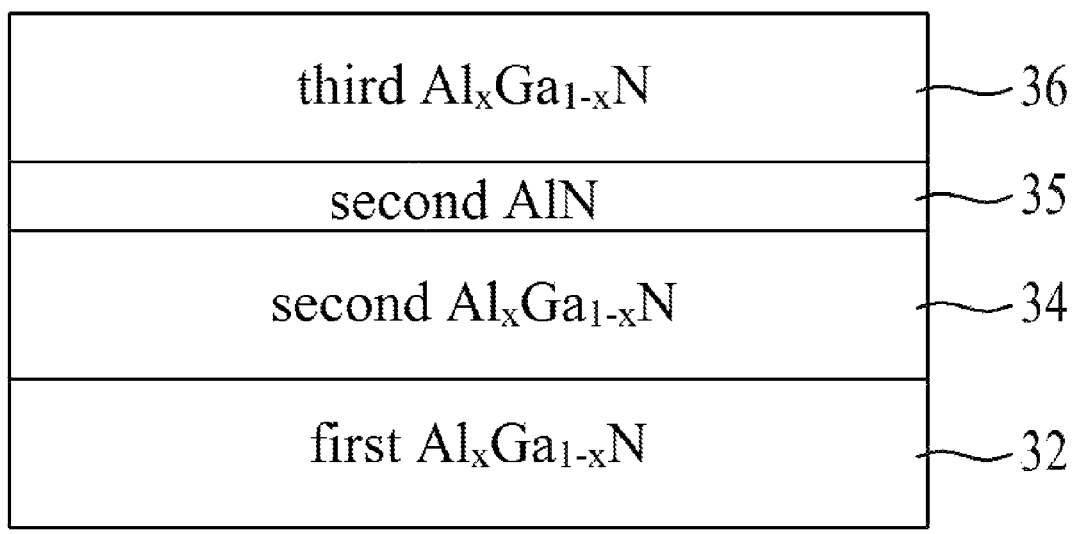
Figure 3D:
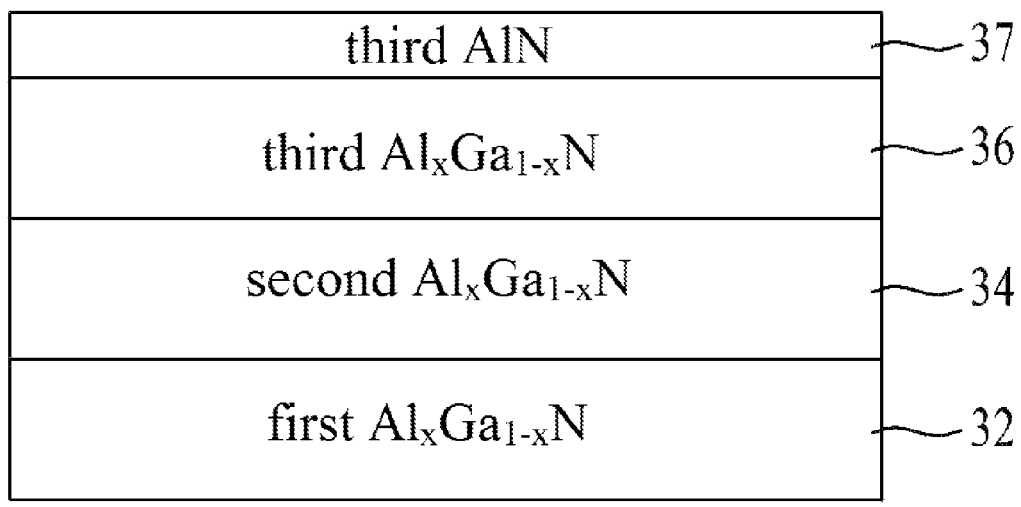
Figure 3E:
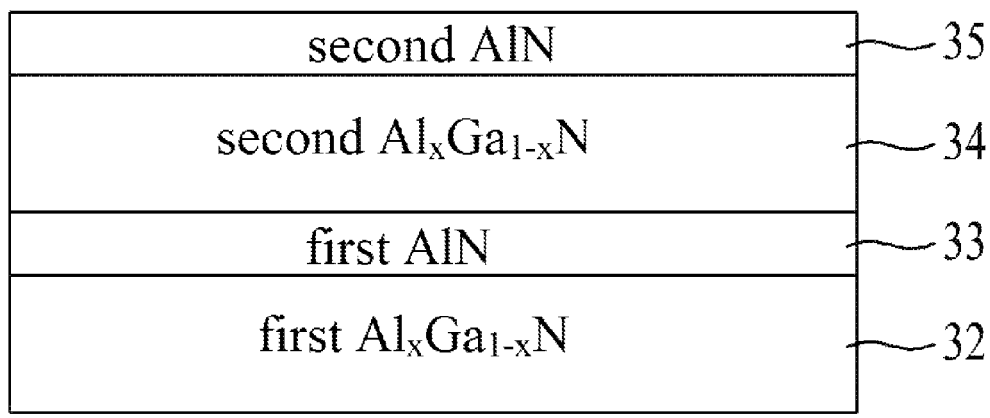
Figure 3F:
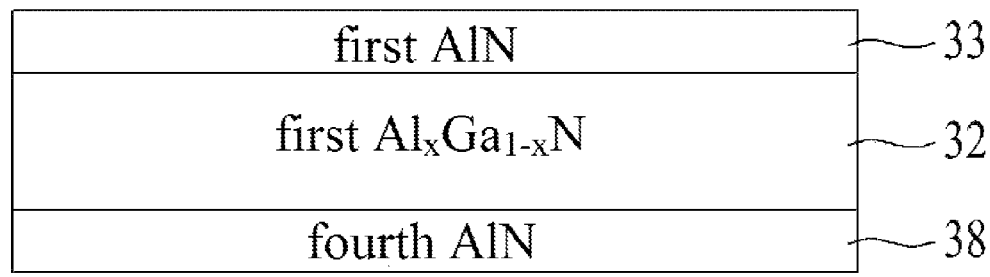

In another embodiment, as illustrated in FIG. 3E, in the transition layer 30E, the first and second AlN layers 33 and 35 as the inserted buffer layers may be respectively disposed on the first and second AlxGa1−xN layers 32 and 34. In another embodiment, as illustrated in FIG. 3F, in the transition layer 30F, the first AlN layer 33 as the inserted buffer layer may be disposed on the first AlxGa1−xN layer 32. According to another embodiment, the at least one AlN layer as the inserted buffer layer may include first to K−1th AlN layers disposed between the first to Kth AlxGa1−xN layers.

For example, as illustrated in FIG. 3B, in the transition layer 30B, the first AlN layer 33 may be disposed between the first AlxGa1−xN layer 32 and the second AlxGa1−xN layer 34, and the second AlN layer 35 may be disposed between the second AlxGa1−xN layer 34 and the third AlxGa1−xN layer 36.

In another embodiment, as illustrated in FIG. 3C, in the transition layer 30C, the second AlN layer 35 may be disposed between the second AlxGa1−xN layer 34 and the third AlxGa1−xN layer 36.

According to still another embodiment, the at least one AlN layer as the inserted buffer layer may be disposed below the AlxGa1−xN layers.

For example, as illustrated in FIG. 3F, in the transition layer 30F, a fourth AlN layer 38 may be disposed below the first AlxGa1−xN layer 32.

In another embodiment, as illustrated in FIG. 3D, the at least one AlN layer as the inserted buffer layer may be disposed at the upper end portion of the transition layer. Alternatively, the at least one AlN layer as the inserted buffer layer may be disposed at the lower end portion of the transition layer.

According to another embodiment, the AlN layer constituting the inserted buffer layer may include first to K+1th AlN layers disposed respectively between the first to Kth AlxGa1−xN layers, at a lower end portion of the transition layer, and at an upper end portion of the transition layer.

Hereinbefore, disposition of the AlN layer as the inserted buffer layer at least one of on, below, or between the AlxGa1−xN layers has been described, but the disclosure is not limited thereto.

In the transition layers 30A to 30F respectively illustrated in FIGS. 3A to 3F, the first to fourth AlN layers 33, 35, 37 and 38 as the inserted buffer layers may be grown at a high or low temperature as described above. In addition, the thickness of each of the first to fourth AlN layers 33, 35, 37 and 38 may be 10 nm to 50 nm.

In addition, the thicknesses of the first to fourth AlN layers 33, 35, 37 and 38 may increase with increasing distance from the initial buffer layer 20.

In addition, the thickness of each of the first to fourth AlN layers 33, 35, 37 and 38 may be less than the thicknesses of the first to third AlxGa1−xN layers 32, 34 and 36.

Meanwhile, the semiconductor device 100A illustrated in FIG. 2 may further include the device layer 40 disposed on the transition layer 30. For example, the device layer 40 may include a Group III-V compound semiconductor, e.g., a GaN semiconductor and include various types of compound semiconductor layers according to semiconductor device applications.

Figure 4:
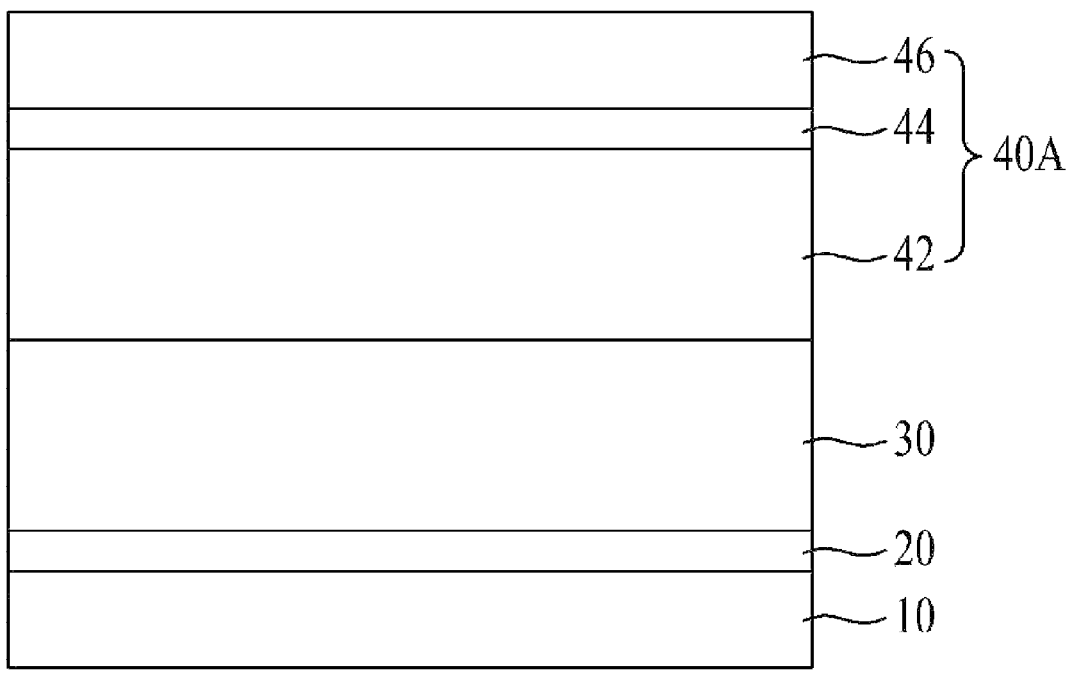
FIG. 4 is a sectional view of a semiconductor device according to an embodiment, embodied as a light emitting device using the semiconductor device illustrated in FIG. 2.

FIG. 4 is a sectional view of a semiconductor device 100B according to an embodiment, embodied as a light emitting device using the semiconductor device 100A of FIG. 2. The same reference numerals of FIG. 4 as those of FIG. 2 denote like elements and thus a detailed description thereof will be omitted herein.

Referring to FIG. 4, the semiconductor device 100B includes the substrate 10, the initial buffer layer 20, the transition layer 30, and a device layer 40A. The device layer 40A corresponds to the device layer 40 of FIG. 2. In this regard, the device layer 40A may include a light emitting structure.

The light emitting structure of the device layer 40A include a first conductive type semiconductor layer 42 disposed on the transition layer 30, an active layer 44 disposed on the first conductive type semiconductor layer 42, and a second conductive type semiconductor layer 46 disposed on the active layer 44.

The first conductive type semiconductor layer 42 may include a Group III-V compound semiconductor doped with a first conductive type dopant and include a semiconductor material having the formula $Al_y In_z Ga_{(1-y-z)}N$ where $0 \leq y \leq 1$, $0 \leq z \leq 1$, and $0 \leq y+z \leq 1$. For example, the first conductive type semiconductor layer 42 may be formed of at least one selected from among GaN, InN, AlN, InGaN, AlGaN, InAlGaN, AlInN, AlGaAs, InGaAs, AlInGaAs, GaP, AlGaP, InGaP, AlInGaP, and InP. In addition, when the first conductive type semiconductor layer 42 is an n-type semiconductor layer, the first conductive type dopant may be an n-type dopant such as Si, Ge, Sn, Se, or Te, but the disclosure is not limited thereto.

The active layer 44 is a layer in which electrons (or holes) injected via the first conductive type semiconductor layer 42 and holes (or electrons) injected via the second conductive type semiconductor layer 46 are recombined to emit light with energy determined by an intrinsic energy band of a material constituting the active layer 44.

The active layer 44 may have at least any one of a single well structure, a multiwell structure, a single quantum well structure, a multiple quantum well (MQW) structure, a quantum wire structure, or a quantum dot structure. For example, the active layer 44 may have an MQW structure through injection of trimethyl gallium (TMG) gas, ammonia (NH3) gas, nitrogen (N2) gas, and trimethyl indium (TMIn) gas, but the disclosure is not limited thereto.

A well layer/barrier layer of the active layer 44 may be formed of at least one pair structure of InGaN/GaN, InGaN/InGaN, GaN/AlGaN, InAlGaN/GaN, GaAs(InGaAs)/AlGaAs, or GaP(InGaP)/AlGaP, but the disclosure is not limited thereto. The well layer may be formed of a material having a smaller bandgap than that of the barrier layer.

The second conductive type semiconductor layer 46 may include a Group III-V compound semiconductor doped with a second conductive type dopant and include a semiconductor material having the formula $In_yAl_zGa_{1-y-z}N$ where $0 \leq y \leq 1$, $0 \leq z \leq 1$, and $0 \leq y+z \leq 1$. For example, when the second conductive type semiconductor layer 46 is a p-type semiconductor layer, the second conductive type dopant may be a p-type dopant such as Mg, Zn, Ca, Sr, Ba, or the like, but the disclosure is not limited thereto.

In the light emitting structure described above, the first conductive type semiconductor layer 42 is formed as an n-type semiconductor layer and the second conductive type semiconductor layer 46 is formed as a p-type semiconductor layer. However, in another embodiment, the first conductive type semiconductor layer 42 may be formed as a p-type semiconductor layer and the second conductive type semiconductor layer 46 may be formed as an n-type semiconductor layer. That is, the light emitting structure may be embodied as any one of an n-p junction structure, a p-n junction structure, an n-p-n junction structure, and a p-n-p junction structure.

Although not shown, first and second electrodes (not shown) electrically connected respectively to the first and second conductive type semiconductor layers 42 and 46 may be disposed. As such, manufacture of a light emitting device may be completed by applying a metal material and/or an insulating material other than a semiconductor material to the semiconductor device 100B of FIG. 4. A process of manufacturing a light emitting device using the above-described semiconductor device is well known in the art and thus a detailed description thereof will be omitted herein.

Figure 5A:
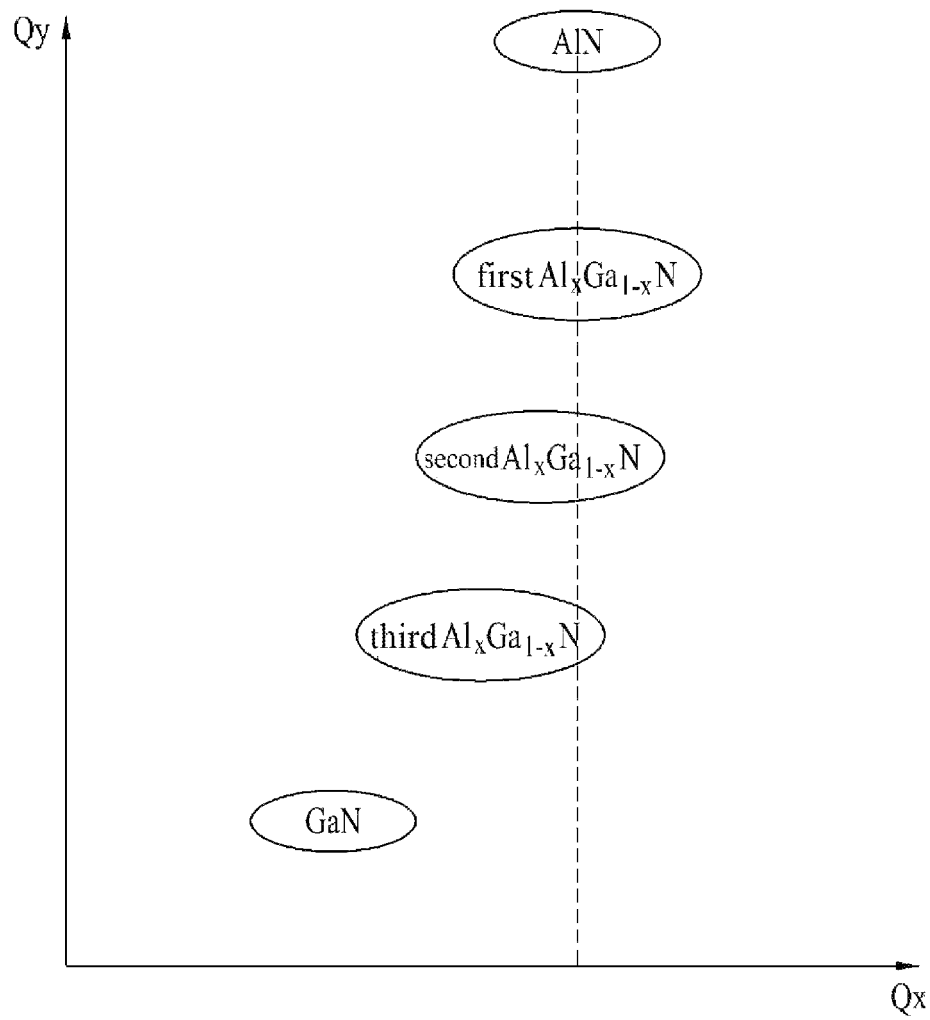
FIGS. 5A and 5B are graphs for explaining conventional strain control and strain control according to an embodiment.
Figure 5B:
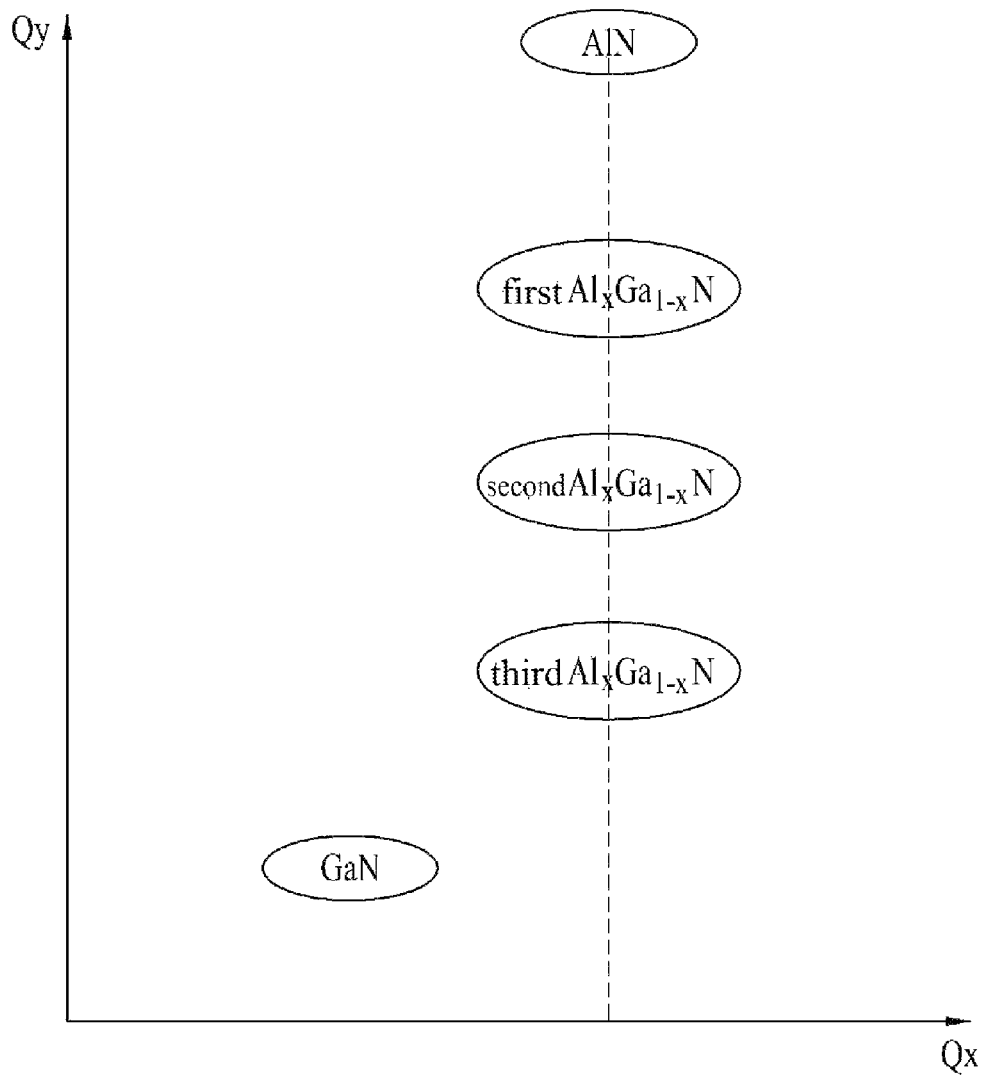

FIGS. 5A and 5B are graphs for explaining conventional strain control and strain control according to an embodiment of the present application. In FIGS. 5A and 5B, the transverse axis denotes an in-plane lattice parameter Qx and the longitudinal axis denotes an out-of-plane lattice parameter Qy. In this regard, the uppermost AlN layer denotes the initial buffer layer 20 and the lowermost GaN layer denotes the device layer 40.

When the transition layer 30 illustrated in FIG. 2 does not include an inserted buffer layer but does include the first to Kth $Al_xGa_{1-x}N$ layers alone, as illustrated in FIG. 5A, tensile stress relaxation occurs in the second and third $Al_xGa_{1-x}N$ layers 34 and 36 when growing a semiconductor device and thus it may be difficult to apply compressive strain to the device layer 40.

However, in a semiconductor device according to an embodiment of the present application, the inserted buffer layer is disposed at the first to Kth $Al_xGa_{1-x}N$ layers. For example, as illustrated in FIG. 5B, when the second and third AlN layers 35 and 37 are respectively disposed on the second and third $Al_xGa_{1-x}N$ layers 34 and 36, occurrence of tensile stress relaxation is prevented and thus compressive strain compensating for tensile strain may be more effectively applied to the device layer 40. Accordingly, occurrence of cracks may be prevented when growing the device layer 40 and the device layer 40 may be grown to a greater thickness.

Hereinafter, a method of manufacturing the semiconductor device 100A of FIG. 2 will be described with reference to FIGS. 6A to 6E. In the present embodiment, the substrate 10 is a silicon substrate, the initial buffer layer 20 includes an AlN layer, the transition layer 30 is formed as illustrated in FIG. 3A, and the device layer 40 is an undoped GaN layer 40B (hereinafter referred to as a uGaN layer). However, the manufacturing method of the semiconductor device 100A of FIG. 2 is not limited to the above example and the semiconductor device 100A may also be manufactured using various other methods.

Figure 6A:
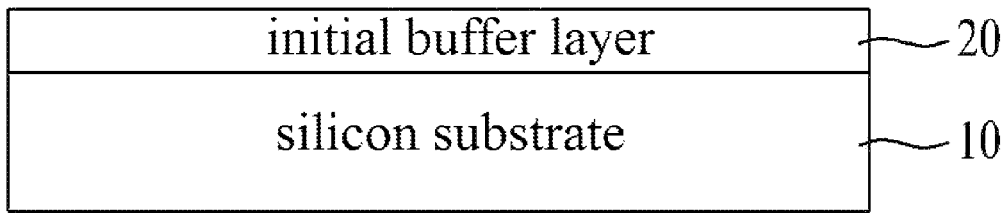
FIGS. 6A to 6E are sectional views illustrating a semiconductor device manufacturing method according to an embodiment.

FIGS. 6A to 6E are sectional views illustrating a semiconductor device manufacturing method according to an embodiment. Referring to FIG. 6A, the silicon substrate 10 is prepared. In this regard, the silicon substrate 10 is exposed to TMA gas for 15 seconds in the absence of ammonia gas to deposit an ultrathin aluminum film thereon, which prevents formation of silicon nitride on a surface of the silicon substrate 10. In some cases, a process of removing a natural oxide film formed on the silicon substrate 10 through rapid annealing of the silicon substrate 10 up to a temperature of, about 900° C., for example, may be further performed. However, the disclosure is not limited to the above examples and the silicon substrate 10 may be prepared using various other methods.

Subsequently, the initial buffer layer 20 having a predetermined thickness and formed of AlN is completed on the silicon substrate 10 at about 900° C. using ammonia. In this regard, when the thickness of the initial buffer layer 20 is a crystal thickness or greater, a 3D growth mode of the initial buffer layer 20 is transformed to a 2D growth mode due to coalescence of AlN islands. The coalesced AlN islands completely cover the silicon substrate 10 and thus diffusion of silicon atoms may be prevented. In other embodiments, the initial buffer layer 20 formed of AlN may be formed on the silicon substrate 10 using various other methods.

Figure 6B:
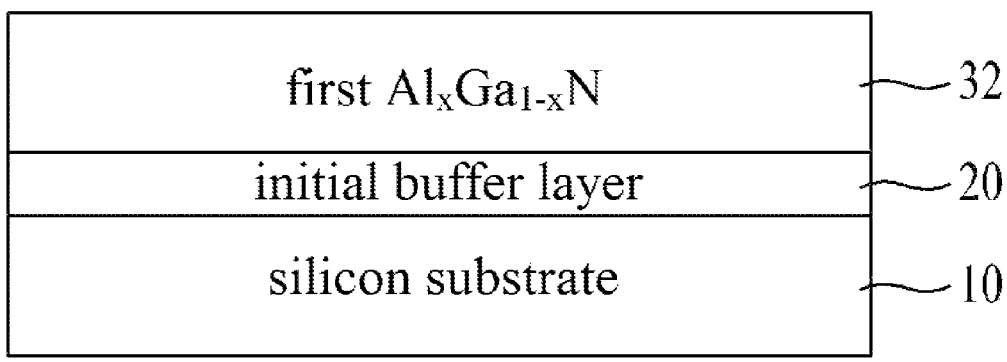
Figure 6C:
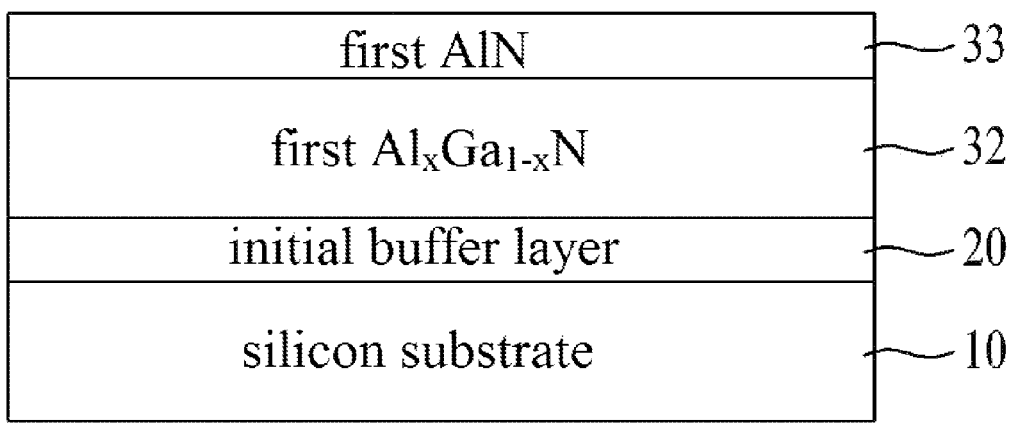
Figure 6D:
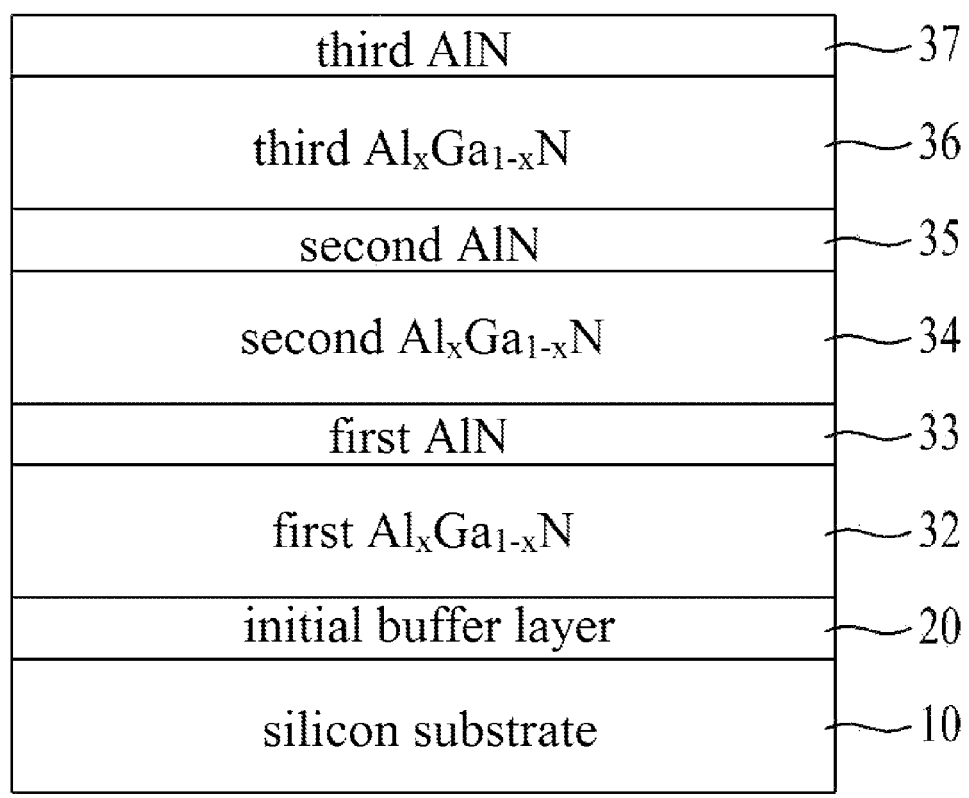

Subsequently, as illustrated in FIGS. 6B to 6D, the first $Al_xGa_{1-x}N$ layer 32, the first AlN layer 33, the second $Al_xGa_{1-x}N$ layer 34, the second AlN layer 35, the third $Al_xGa_{1-x}N$ layer 36, and the third AlN layer 37 are sequentially formed on the initial buffer layer 20.

Figure 6E:
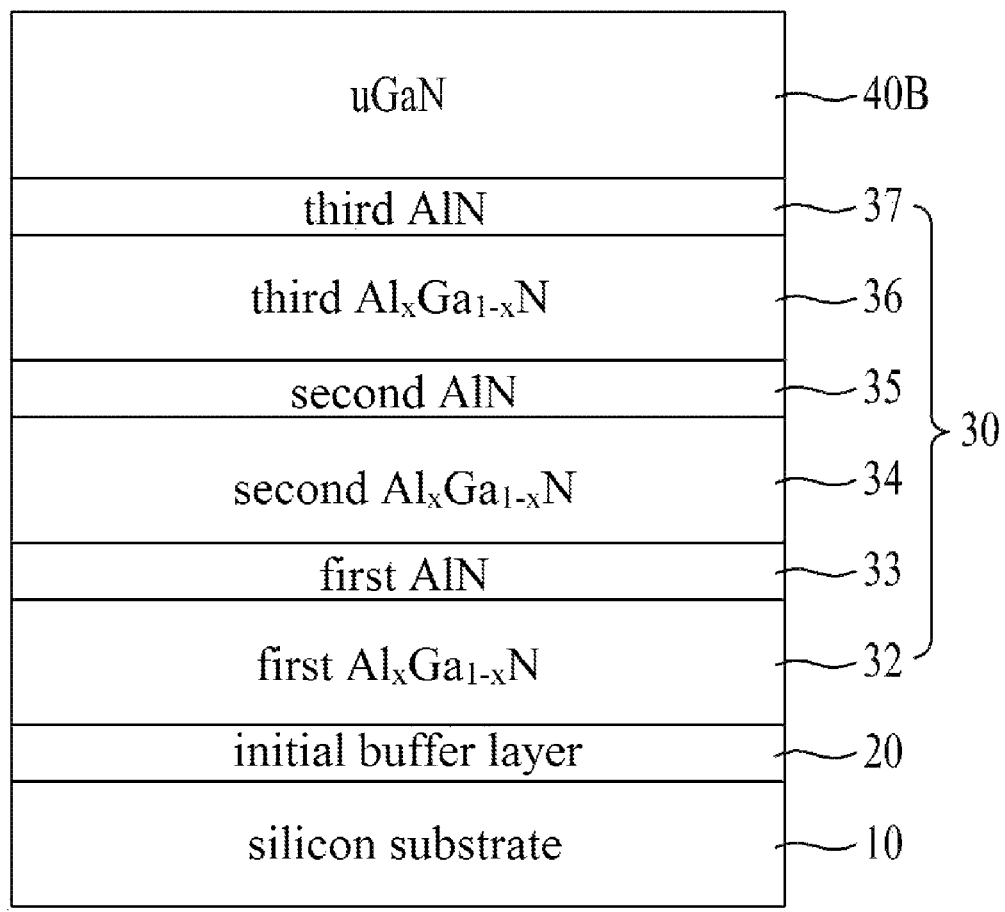

In this regard, the first, second and third $Al_xGa_{1-x}N$ layers 32, 34 and 36 are formed so that Al contents (x=x1, x2 and x3) of the first, second and third $Al_xGa_{1-x}N$ layers 32, 34 and 36 decrease with increasing distance from the initial buffer layer 20, i.e., x1, x2 and x3 satisfy the relationship represented by Equation 1 above. That is, the first, second and third $Al_xGa_{1-x}N$ layers 32, 34 and 36 are formed so that the Al contents of the first, second and third $Al_xGa_{1-x}N$ layers 32, 34 and 36 decrease with increasing distance from the initial buffer layer 20 and Ga contents thereof increase with increasing distance from the initial buffer layer 20. Subsequently, as illustrated in FIG. 6E, a uGaN layer as the device layer 40B may be formed on the third AlN layer 37.

For example, in the processes described above with reference to FIGS. 6A to 6E, Ga, Al and N may be grown by metal organic chemical vapor deposition (MOCVD). That is, a structure including Ga, Al, and N may be formed using a precursor material including TMG, TMA, and NH3 by MOCVD.

Meanwhile, the semiconductor device 100A of FIG. 2 may be used for power devices such as a high electron mobility transistor (HEMT), a heterostructure field effect transistor (HFET), a double HFET, and the like.

Hereinafter, an HEMT 100C including the semiconductor device 100A of FIG. 2 will be described below with reference to FIG. 7. In this regard, the same reference numerals of FIG. 7 as those of FIG. 2 denote like elements and thus a detailed description thereof will be omitted herein.

Figure 7:
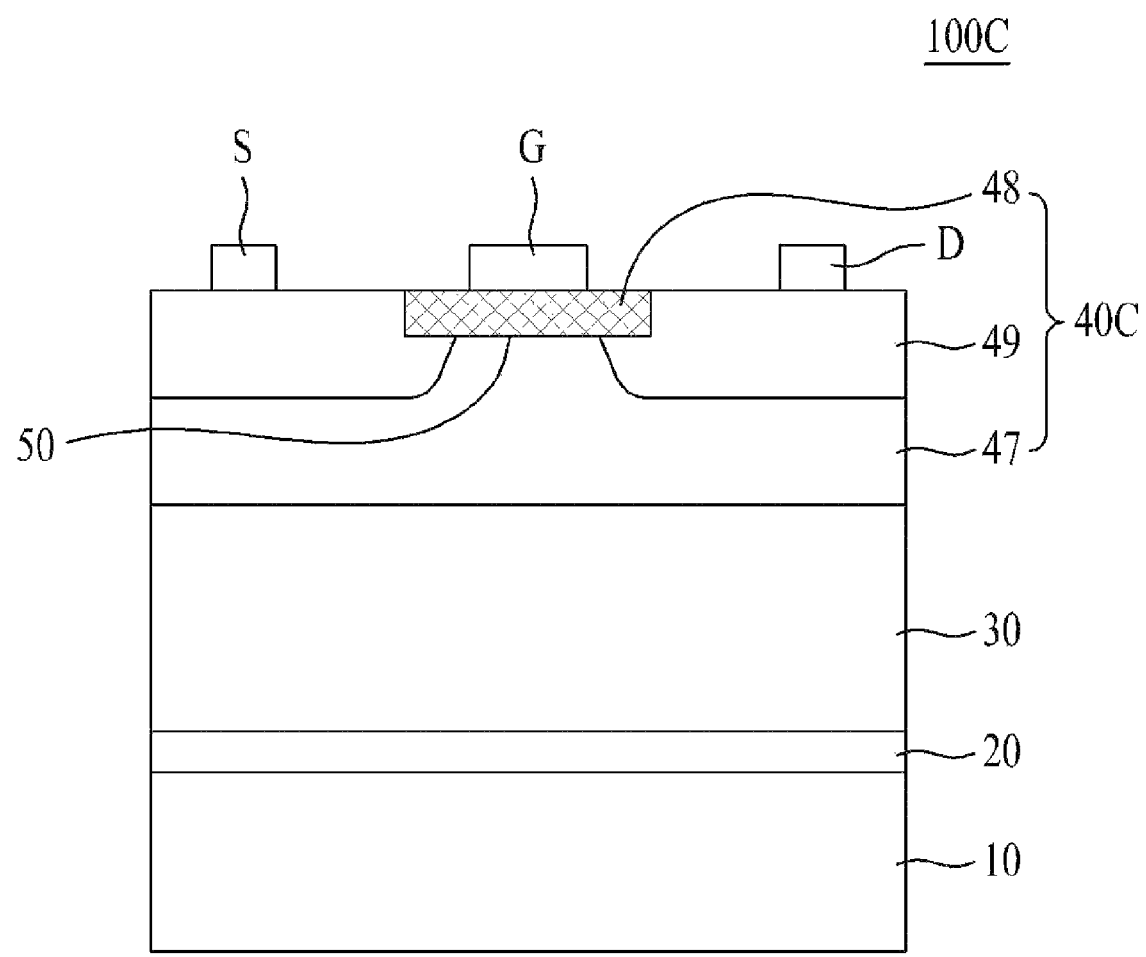
FIG. 7 is a sectional view of a semiconductor device according to another embodiment, embodied as a high electron mobility transistor (HEMT) using the semiconductor device of FIG. 2.

FIG. 7 is a sectional view of a semiconductor device 100C according to another embodiment, embodied as a HEMT using the semiconductor device 100A of FIG. 2. Referring to FIG. 7, the semiconductor device 100C includes the substrate 10, the initial buffer layer 20, the transition layer 30, and a device layer 40C. The device layer 40C corresponds to the device layer 40 of FIG. 2. In this regard, the device layer 40C includes a channel layer 47, an undoped AlGaN layer 48 (hereinafter referred to as a uAlGaN layer), an n-type or p-type GaN layer 49, a gate electrode G, and plural contacts S and D.

The channel layer 47 may be formed including undoped GaN and is disposed on the transition layer 30. The uAlGaN layer 48 is disposed on an upper portion of the channel layer 47 via a heterojunction 50. In addition, the gate electrode G formed using a material such as gold (Au) is disposed on the uAlGaN layer 48.

When a channel formed by the channel layer 47 is an n-type channel, the n-type GaN layer 49 is disposed on an upper portion of the channel layer 47 and at opposite sides of the uAlGaN layer 48. When a channel formed by the channel layer 47 is a p-type channel, however, the p-type GaN layer 49 is disposed on an upper portion of the channel layer 47 and at opposite sides of the uAlGaN layer 48. The GaN layer 49 may be buried in the channel layer 47.

At least one of the contacts S and D is disposed on the GaN layer 49 and at opposite sides of the uAlGaN layer 48. In this regard, the at least one of the contacts S and D may include a source contact S that may be formed of Al and a drain contact D that may be formed of Al. The source contact S is disposed on the GaN layer 49 disposed on the channel layer 47, and the drain contact D is disposed on the GaN layer 49 to be spaced apart from the source contact D.

In addition, the semiconductor device 100A of FIG. 2 may be applied to various fields such as a photodetector, a gated bipolar junction transistor, a gated hot electron transistor, a gated heterostructure bipolar junction transistor, a gas sensor, a liquid sensor, a pressure sensor, a multi-function sensor having pressure and temperature sensor functions, a power switching transistor, a microwave transistor, a lighting device, and the like.

Figure 8:
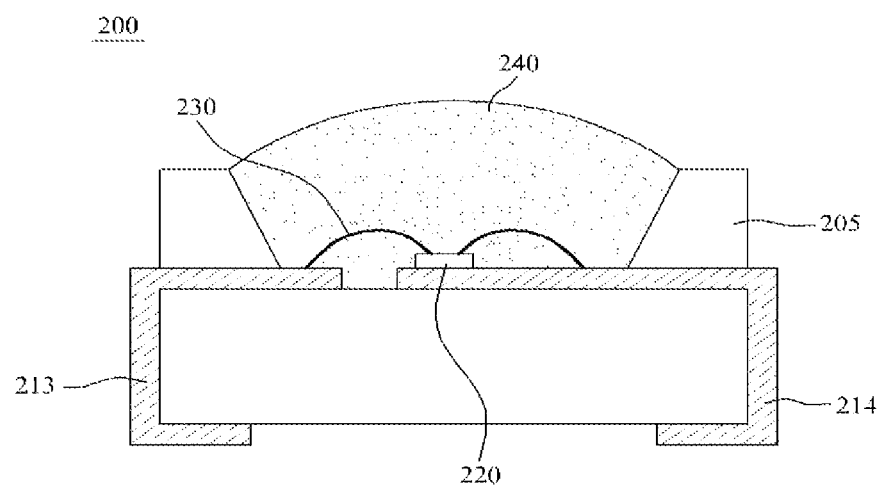
FIG. 8 is a sectional view of a light emitting device package according to an embodiment.

Hereinafter, configuration and operation of a light emitting device package including a light emitting device using the semiconductor device 100B described above will be described. FIG. 8 is a sectional view of a light emitting device package 200 according to an embodiment of the present application.

The light emitting device package 200 according to the present embodiment includes a package body part 205, first and second lead frames 213 and 214 installed at the package body part 205, a light emitting device 220 disposed at the package body part 205 to be electrically connected to the first and second lead frames 213 and 214, and a molding member 240 to surround the light emitting device 220. The package body part 205 may be formed using silicon, a synthetic resin, or a metal and may have inclined surfaces formed in the vicinity of the light emitting device 220.

The first and second lead frames 213 and 214 are electrically insulated from each other and serve to supply power to the light emitting device 220. In addition, the first and second lead frames 213 and 214 may enhance luminous efficacy by reflecting light emitted from the light emitting device 220 and dissipate heat generated by the light emitting device 220 to the outside. The light emitting device 220 may include the semiconductor device 100B illustrated in FIG. 4, but the disclosure is limited thereto.

As illustrated in FIG. 8, the light emitting device 220 may be disposed on the second lead frame 214. However, in another embodiment, the light emitting device 220 may be disposed on the first lead frame 213 or the package body part 205.

The light emitting device 220 may be electrically connected to the first lead frame 213 and/or the second lead frame 214 by any one of a wire method, a flip-chip method, and a die-bonding method. The light emitting device 220 illustrated in FIG. 8 is electrically connected to the first and second lead frames 213 and 214 via wires 230, but the disclosure is not limited thereto.

The molding member 240 may surround the light emitting device 220 to protect the light emitting device 220. In addition, the molding member 240 may include a phosphor and thus change a wavelength of light emitted from the light emitting device 220.

A plurality of light emitting device packages according to an embodiment is arrayed on a substrate, and optical members such as a light guide plate, a prism sheet, a diffusion sheet, and a fluorescent sheet may be disposed on a path of light emitted from the light emitting device packages. The light emitting device packages, the substrate, and the optical members may function as a backlight unit or a lighting unit. For example, a lighting system may include a backlight unit, a lighting unit, an indicating device, lamps, street lamps, and the like.

Figure 9:
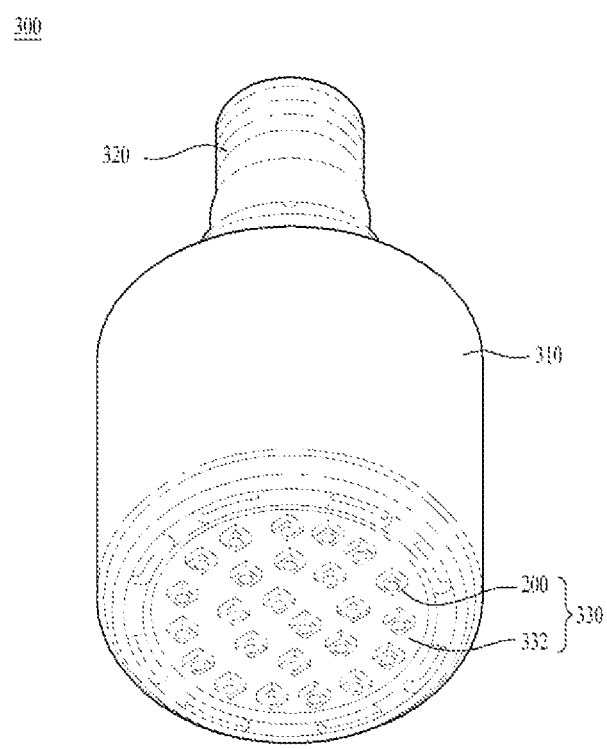
FIG. 9 is a perspective view of a lighting unit according to an embodiment.

FIG. 9 is a perspective view of a lighting unit 300 according to an embodiment. The lighting unit 300 of FIG. 9 is given as one example of a lighting system and the disclosure is not limited thereto. In the present embodiment, the lighting unit 300 may include a case body 310, a connection terminal 320 installed at the case body 310 and receiving power from an external power supply, and a light emitting module unit 330 installed at the case body 310. The case body 310 may be formed of a material having good heat dissipation characteristics, for example, a metal or a resin.

The light emitting module unit 330 may include a substrate 332 and at least one light emitting device package 200 mounted on the substrate 332. The substrate 332 may be formed by printing a circuit pattern on an insulator. For example, the substrate 332 may include a general printed circuit board (PCB), a metal core PCB, a flexible PCB, a ceramic PCB, and the like. In addition, the substrate 332 may be formed of a material to effectively reflect light, or the substrate 332 may have a colored surface to effectively reflect light, e.g., a white or silver surface.

The at least one light emitting device package 200 may be mounted on the substrate 332. The light emitting device package 200 may include at least one light emitting device 220, e.g., a light emitting diode (LED). In this regard, the light emitting device package 200 may include the light emitting device package 200 illustrated in FIG. 8, but the disclosure is not limited thereto. In addition, the LED may include the semiconductor device 100B of FIG. 4, but the disclosure is not limited thereto. The LED may include a colored LED such as a red LED, a green LED, or a white LED and a UV LED to emit ultraviolet (UV) light.

The light emitting module unit 330 may be configured to have various combinations of the light emitting device packages 200 to acquire desired color and brightness. For example, to acquire a high color rendering index (CRI), white, red and green LEDs may be arranged in combination.

The connection terminal 320 may be electrically connected to the light emitting module unit 330 to supply power. In the embodiment, the connection terminal 320 is spirally fitted in and coupled to an external power supply in a socket coupling manner, but the disclosure is not limited thereto. For example, the connection terminal 320 may take the form of a pin to be inserted into an external power supply, or may be connected to an external power supply via a wiring.

Figure 10:
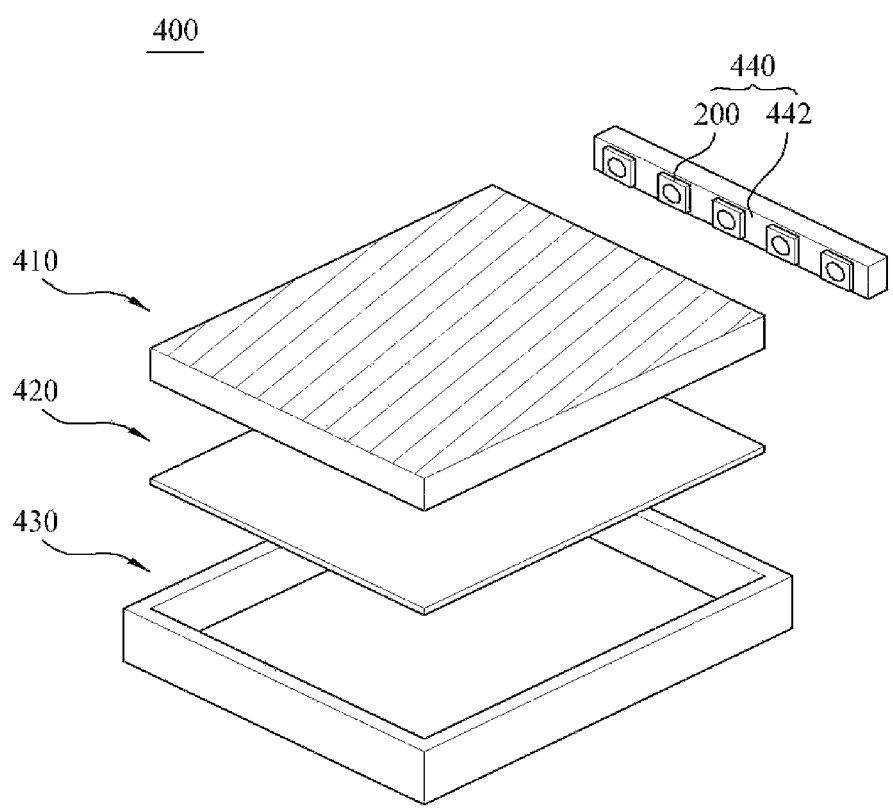
FIG. 10 is an exploded perspective view of a backlight unit according to an embodiment.

FIG. 10 is an exploded perspective view of a backlight unit 400 according to an embodiment. The backlight unit 400 of FIG. 10 is given as one example of a lighting system and the disclosure is not limited thereto.

The backlight unit 400 according to the present embodiment includes a light guide plate 410, a reflective member 420 disposed below the light guide plate 410, a bottom cover 430, and a light emitting module unit 440 to supply light to the light guide plate 410. The bottom cover 430 accommodates the light guide plate 410, the reflective member 420, and the light emitting module unit 440.

The light guide plate 410 serves to convert a point light source into a surface light source by diffusing light. The light guide plate 410 may be formed of a transparent material. For example, the light guide plate 410 may include one of an acrylic resin such as polymethylmethacrylate (PMMA), polyethylene terephthalate (PET) resin, polycarbonate (PC) resin, cycloolefin copolymer (COC) resin, or polyethylene naphthalate (PEN) resin.

The light emitting module unit 440 supplies light to at least one side surface of the light guide plate 410 and, ultimately, acts as a light source of a display device at which a backlight unit is installed. The light emitting module unit 440 may contact the light guide plate 410, but the disclosure is not limited thereto. In particular, the light emitting module unit 440 includes a substrate 442 and the light emitting device packages 200 mounted on the substrate 442. The substrate 442 may contact the light guide plate 410, but the disclosure is not limited thereto.

The substrate 442 may be a printed circuit board (PCB) including a circuit pattern (not shown). However, in another embodiment, the substrate 442 may be a metal core PCB (MCPCB), a flexible PCB, or the like as well as a general PCB, but the disclosure is not limited thereto.

In addition, the light emitting device packages 200 may be mounted on the substrate 442 such that a light emitting surface is spaced apart from the light guide plate 410 by a predetermined distance. In this regard, the light emitting device package 200 may include the light emitting device package 200 illustrated in FIG. 8, but the disclosure is not limited thereto.

The reflective member 420 may be formed below the light guide plate 410. The reflective member 420 reflects light incident upon a lower surface of the light guide plate 410 to direct light upward and thus may enhance brightness of the backlight unit 400. The reflective member 420 may be formed of, for example, PET resin, PC resin, PVC resin, or the like, but the disclosure is not limited thereto.

The bottom cover 430 may accommodate the light guide plate 410, the light emitting module unit 440, the reflective member 420, and the like. For this, the bottom cover 430 may have a box shape with an open upper surface, but the disclosure is not limited thereto. The bottom cover 430 may be formed of a metal or a resin and manufactured by a method such as press molding, extrusion molding, or the like.

As is apparent from the above description, in semiconductor devices according to embodiments, an inserted buffer layer is disposed at least one of below, on or between a plurality of $Al_xGa_{1-x}N$ layers and thus occurrence of tensile strain relaxation is prevented and, accordingly, compressive strain compensating for tensile strain may be more effectively applied to a device layer. Thus, occurrence of cracks may be prevented when growing the device layer and the device layer may be grown to a greater thickness.

Embodiments provide semiconductor devices that may prevent occurrence of cracks and include a thicker device layer.

In one embodiment, a semiconductor device includes a silicon substrate, an initial buffer layer disposed on the silicon substrate, a transition layer disposed on the initial buffer layer, and a device structure disposed on the transition layer, wherein the transition layer includes at least one of $Al_xGa_{1-x}N$ (where $0<x<1$) layers disposed on the initial buffer layer and an inserted buffer layer disposed at least one of between the $Al_xGa_{1-x}N$ layers, at a lower end portion of the transition layer, or an upper end portion of the transition layer.

The inserted buffer layer may include at least one AlN layer.

The $Al_xGa_{1-x}N$ layers may include first to Kth $Al_xGa_{1-x}N$ layers, wherein K is a positive integer of 1 or more, sequentially disposed on the initial buffer layer.

The $Al_xGa_{1-x}N$ layers may have an Al concentration gradient such that amounts of Al gradually decrease with increasing distance from the initial buffer layer.

The at least one AlN layer may be one of the following:

the AlN layer comprising first to Kth AlN layers respectively disposed on the first to Kth $Al_xGa_{1-x}N$ layers;

the AlN layer comprising first to K−1th AlN layers disposed respectively between the first to Kth $Al_xGa_{1-x}N$ layers;

the AlN layer being only one AlN layer which is disposed at the upper end portion of the transition layer, or which is disposed at the lower end portion of the transition layer;

the AlN layer comprising a first AlN layer disposed below the first $Al_xGa_{1-x}N$ layer, and a second AlN layer disposed on the Kth $Al_xGa_{1-x}N$ layer;

the AlN layer being inserted between any two adjacent $Al_xGa_{1-x}N$ layers; or the AlN layer comprising first to K+1th AlN layers disposed respectively between the first to Kth $Al_xGa_{1-x}N$ layers, at a lower end portion of the transition layer, and at an upper end portion of the transition layer.

K may be 7.

The AlN layer may be grown at a low temperature of 750° C. to 950° C. or a high temperature of 1000° C. to 1100° C.

The AlN layer may have a thickness of 10 nm to 50 nm.

The AlN layer may include a plurality of AlN layers, and thicknesses of the AlN layers may increase with increasing distance from the initial buffer layer.

The AlN layer may have a smaller thickness than the AlxGa1-xN layers.

In another embodiment, a light emitting device includes any one of the semiconductor device described as above, wherein the device structure is a light emitting structure.

The light emitting structure may include a first conductive type semiconductor layer disposed on the transition layer, an active layer disposed on the first conductive type semiconductor layer, and a second conductive type semiconductor layer disposed on the active layer.

In another embodiment, a light emitting device package includes a package body part, first and second lead frames disposed at the package body part to be electrically insulated from each other, any one of the semiconductor device described as above disposed in the package body part and electrically connected to the first and second lead frames, and a molding member disposed to surround the semiconductor device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device, comprising:
    a silicon substrate;
    an initial buffer layer provided on the silicon substrate;
    a transition layer provided on the initial buffer layer; and
    a semiconductor device structure provided on the transition layer,
    wherein the transition layer includes at least one of $Al_xGa_{1-x}N$ (where $0<x<1$) layers provided on the initial buffer layer, and an inserted buffer layer provided at least one of between the $Al_xGa_{1-x}N$ layers, at a lower end portion of the transition layer, or at an upper end portion of the transition layer,
    wherein the inserted buffer layer comprises at least one AlN layer,
    wherein the $Al_xGa_{1-x}N$ layers comprise first to $K^{th}$ $Al_xGa_{1-x}N$ layers, wherein K is a positive integer of 1 or more, sequentially disposed on the initial buffer layer, and
    wherein the at least one AlN layer is one of the following:
        the AlN layer comprising first to $K^{th}$ AlN layers respectively disposed on the first to $K^{th}$ $Al_xGa_{1-x}N$ layers;
        the AlN layer comprising first to $K-1^{th}$ AlN layers disposed respectively between the first to $K^{th}$ $Al_xGa_{1-x}N$ layers;
        the AlN layer being only one AlN layer which is disposed at the upper end portion of the transition layer, or which is disposed at the lower end portion of the transition layer;
        the AlN layer comprising a first AlN layer disposed below the first $Al_xGa_{1-x}N$ layer, and a second AlN layer disposed on the $K^{th}$ $Al_xGa_{1-x}N$ layer;
        the AlN layer being inserted between any two adjacent $Al_xGa_{1-x}N$ layers; or
        the AlN layer comprising first to $K+1^{th}$ AlN layers disposed respectively between the first to $K^{th}$ $Al_xGa_{1-x}N$ layers, at a lower end portion of the transition layer, and at an upper end portion of the transition layer.

2. The semiconductor device according to claim 1, wherein the $Al_xGa_{1-x}N$ layers have an Al concentration gradient such that amounts of Al gradually decrease with increasing distance from the initial buffer layer.

3. The semiconductor device according to claim 1, wherein K is 7.

4. The semiconductor device according to claim 1, wherein the AlN layer is grown at a low temperature of 750° C. to 950° C.

5. The semiconductor device according to claim 1, wherein the AlN layer is grown at a high temperature of 1000° C. to 1100° C.

6. The semiconductor device according to claim 1, wherein the AlN layer has a thickness of 10 nm to 50 nm.

7. The semiconductor device according to claim 1, wherein the AlN layer includes a plurality of AlN layers,
    wherein thicknesses of the AlN layers increase with increasing distance from the initial buffer layer.

8. The semiconductor device according to claim 1, wherein the AlN layer has a smaller thickness than the $Al_xGa_{1-x}N$ layers.

9. A light emitting device, comprising the semiconductor device according to claim 1, wherein the device structure is a light emitting structure.

10. The light emitting device according to claim 9, wherein the light emitting structure comprises:
    a first conductive type semiconductor layer disposed on the transition layer;
    an active layer disposed on the first conductive type semiconductor layer; and
    a second conductive type semiconductor layer disposed on the active layer.

11. The semiconductor device of claim 1 provided on a package body part of a light emitting device package, the light emitting device package further comprising:
    first and second lead frames provided at the package body part configured to be electrically insulated from each other and electrically connected to the semiconductor device; and
    a molding member provided to surround the semiconductor device.

* * * * *